US006944843B2

United States Patent
Bansal (10) Patent No.: US 6,944,843 B2
(45) Date of Patent: Sep. 13, 2005

(54) METHOD FOR PROVIDING A CELL-BASED ASIC DEVICE WITH MULTIPLE POWER SUPPLY VOLTAGES

(75) Inventor: Jai P. Bansal, Manassas, VA (US)

(73) Assignee: BAE Systems, Information and Electronic Systems Integration, Inc., Nashua, NH (US)

(*) Notice: Subject to any disclaimer, the term of this patent is extended or adjusted under 35 U.S.C. 154(b) by 0 days.

(21) Appl. No.: 10/634,229

(22) Filed: Aug. 5, 2003

(65) Prior Publication Data

US 2005/0034095 A1 Feb. 10, 2005

(51) Int. Cl.[7] ................................. G06F 17/50
(52) U.S. Cl. ..................... 716/16; 716/7; 716/8
(58) Field of Search ............... 716/1, 7, 8, 9, 716/16

(56) References Cited

U.S. PATENT DOCUMENTS

| | | | | |
|---|---|---|---|---|
| 5,723,883 A | * | 3/1998 | Gheewalla | 257/204 |
| 6,091,090 A | * | 7/2000 | Gheewala | 257/211 |
| 6,466,054 B2 | * | 10/2002 | Kameyama et al. | 326/68 |
| 6,538,470 B1 | * | 3/2003 | Langhammer et al. | 326/41 |
| 6,710,621 B2 | * | 3/2004 | Devlin et al. | 326/38 |
| 6,747,478 B2 | * | 6/2004 | Madurawe | 326/39 |
| 2003/0101307 A1 | * | 5/2003 | Gemelli et al. | 710/305 |

* cited by examiner

Primary Examiner—Stacy A. Whitmore
Assistant Examiner—Sun James Lin
(74) Attorney, Agent, or Firm—Daniel J. Long; Antony P. Ng; Dillon & Yudell LLP (57) ABSTRACT

A method for designing a cell-based ASIC device with multiple power supply voltages is disclosed. An ASIC chip image is made without applying power or ground buses to metal layer M1. All fast or high-power circuits are grouped together into high-power logic blocks and synthesized with high-power circuit macro libraries. All slow or low-power circuits are grouped together into low-power logic blocks and synthesized with low power circuit macro libraries. The associate power and ground buses are applied to metal layer M1 in each of the logic blocks. The logic blocks are placed on the ASIC so that different voltage groups are separated by at least one cell. The ASIC is then routed and tested before the mask is released.

6 Claims, 7 Drawing Sheets

METHOD FOR PROVIDING A CELL-BASED ASIC DEVICE WITH MULTIPLE POWER SUPPLY VOLTAGES

The application was made with United States government support under contract No. F33615-01-C-1910. The United States government has certain rights to this application.

BACKGROUND OF THE INVENTION

1. Technical Field

The present invention relates to application specific integrated circuit (ASIC) designs in general, and in particular to a method for improving power performance in ASIC designs. Still more particularly, the present invention relates to a method for providing a cell-based ASIC device with multiple power supply voltages in order to achieve optimum power performance.

2. Description of the Related Art

Generally speaking, an application specific integrated circuit (ASIC) device has two main types of circuits, namely, primary input/output circuits and core circuits. The primary input/output circuits enable the ASIC device to communicate with other electronic components located within an electronic system. The core circuits perform various functions for which the ASIC device is intended, such as data processing, data computations, controls, etc. With the development of sub-micron technology processes, very large functions can be incorporated within a single ASIC device.

According to conventional ASIC design methods, all core circuits within an ASIC device are operated at one power supply voltage. However, in many system applications, power dissipation limits the logic functions that can be designed in an ASIC device. Since not all the parts of the logic functions within an ASIC device operate at a maximum system frequency, power supply voltage for those slower circuits that operate at a lower frequency can be reduced such that the total power dissipation of the ASIC device can be decreased accordingly. Consequently, it is desirable to provide a method for designing cell-based ASIC devices with multiple power supply voltages in order to achieve optimum power performances.

SUMMARY OF THE INVENTION

In accordance with a preferred embodiment of the present invention, an application specific integrated circuit (ASIC) chip image is made without applying power bus and ground bus to metal layer M1. All fast or high-power circuits are grouped together into a first set of logic blocks and synthesized with high-power circuit macro libraries. All slow or low-power circuits are grouped together into a second set of logic blocks and synthesized with low-power circuit macro libraries. The associated power and ground buses are applied for metal layer M1 in each of these logic blocks. The logic blocks are placed on the ASIC chip image so that different voltage groups are separated by at least one cell. The ASIC chip is then routed and tested before the mask is released.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

A. Background

In a typical application specific integrated circuit (ASIC) chip, approximately 90% of the total power dissipation is attributed to charging and discharging of circuit and wiring capacitances. The switching power P, also known as dynamic power, of an ASIC chip is given by:

$$P = C(V^2)fS$$

where C is the internal capacitance of a circuit and circuit-to-circuit wiring capacitance, V is the power supply voltage, f is the switching frequency, and S is the switching factor.

Within an ASIC chip, some logic sections must be operated at a maximum frequency while the remaining logic sections can be operated at a reduced frequency without degrading the overall system performance. The reduction of switching frequency can decrease the total power consumption up to a certain extent because power is directly related to switching frequency, as shown in the above-mentioned equation. More importantly, since power dissipation in an ASIC chip is proportional to the square of the power supply voltage, the most efficient way for reducing power dissipation is to reduce the power supply voltage. Hence, power dissipation can be greatly reduced by lowering the power supply voltage to the logic blocks that are operated at a relatively lower switching frequency.

B. Invention

Based on functional connectivity and performance requirements, a function within an ASIC chip can be partitioned in various logic blocks. The logic blocks operating at a relatively higher clock frequency are synthesized using a circuit macro library designed for higher power supply voltages, and logic blocks operating at a relatively lower clock frequency are synthesized using a circuit macro library designed for lower power supply voltages. All circuits within a logic block use only one power supply voltage. Such voltage is distributed at metal level M1 within the logic block, and metal level M1 is not utilized as a power supply bus as part of the chip image busing structure.

The core area of a cell-based ASIC chip includes rows and columns of core cells, where a core cell is defined to have specific width and height dimensions. The physical layout of a logic function may use one or more core cells. As will be described in details, circuits for each logic function are placed using a block of core cells. The block of core cell has a defined boundary shape at a non-fabrication level around the core cell. One logic block area can be different than another logic block area. All circuits within a logic block use only one of the power supply voltages, which is distributed at metal level M1 bus within the block boundary only. The logic blocks are placed in the core area of the ASIC chip in accordance with the floor plan of the ASIC chip. Two logic blocks can be placed adjacent to each other or may have a gap between them. Power supply voltage buses and ground buses at metal levels M2 and above are placed in the core area of the ASIC chip. The ASIC physical design is checked for process design rules and logical to physical connectivity. Mask data is then released to the fabrication line.

C. Multiple Power Supply Voltage Infrastructure Development

Figure 1:
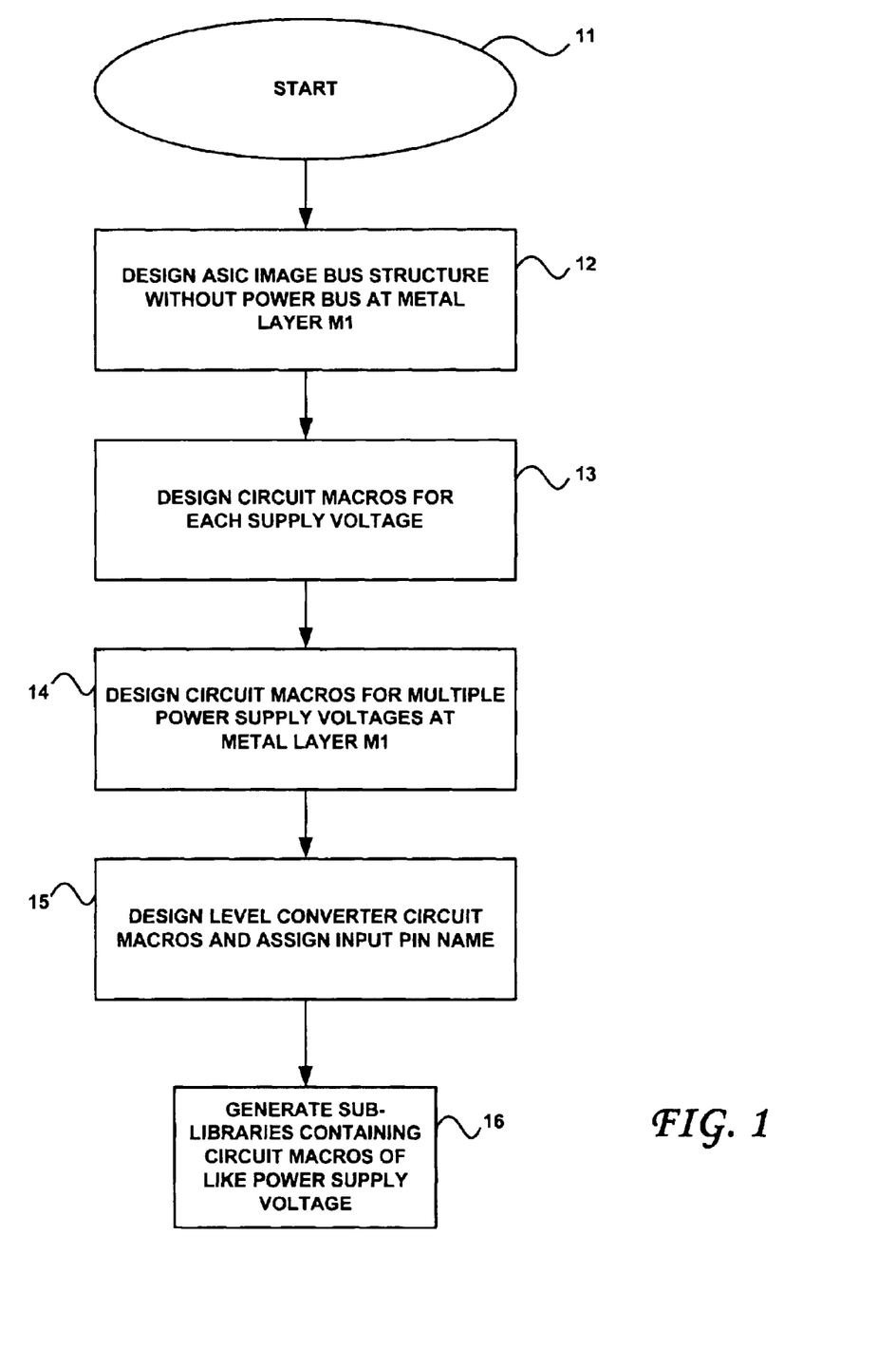
FIG. 1 is a high-level logic flow diagram of a method for developing the infrastructure of an ASIC device having multiple power supply voltages, in accordance with a preferred embodiment of the present invention.

Referring now to the drawings and in particular to FIG. 1, there is depicted a high-level logical flow diagram of a method for developing the infrastructure of an ASIC device having multiple power supply voltages, in accordance with a preferred embodiment of the present invention. Starting in block 11, an ASIC chip image bus structure without any power bus at metal layer M1 is designed, as shown in block 12. Then, circuit macros are designed for each power supply voltage, as depicted in block 13. Next, circuit macros are designed for multiple power supply voltages at metal level M1 only, as shown in block 14. Level converter circuit macros are designed and input pin names are assigned, as depicted in block 15. Finally, sub-libraries containing circuit macros of like power supply voltage are generated, as shown in block 16.

Figure 2:
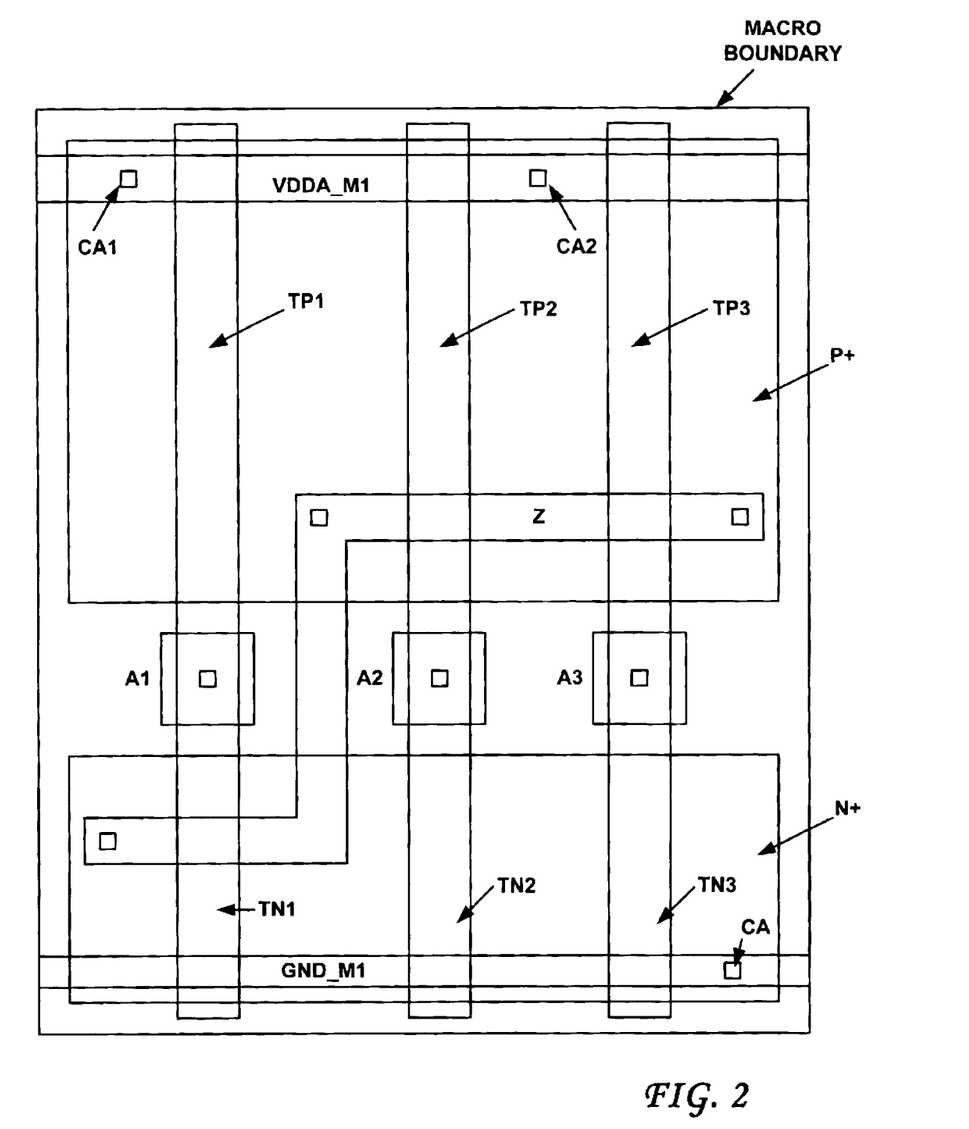
FIG. 2 is an outline of a circuit macro layout, wherein the power supply VDDA_M1 is part of the circuit macro layout.

In the prior art, when designing the library for one power supply voltage or multiple power supply voltages, power bus at metal level M1 is part of the ASIC chip image bus structure. In the present invention, the power supply bus at metal level M1 is part of the circuit macro layout only. As an example, the layout of a Library_VDDA macro NAND3_VDDA_1X is shown in FIG. 2. The interconnections between transistors that make up the NAND macro function is well-known in the art. The source diffusions of p-channel transistors TP1, TP2 and TP3 are connected to a power supply bus VDDA_M1 through contacts CA1 and CA2. The source diffusion of n-channel transistor TN3 is connected to ground bus GND_M1 through contact CA. The power buses and ground buses at metal level M1 are assigned netnames VDDA (supply) and GND (ground). These netnames are used in the ASIC design checks, such as continuity in the voltage and ground nets, and for isolation between VDDA and VDDB nets.

Each circuit macro is designed and characterized at two or more power supply voltages, namely, VDDA, VDDB, VDDC, and so. For example, there are three sub-libraries in the main ASIC library, as follows:

1. Library_VDDA functions are designed for a high voltage VDDA;
2. Library_VDDB functions are designed for a low voltage VDDB; and
3. Library_IO functions are designed for one or two supply voltages.

Each of the above-mentioned three sub-libraries has a complete set of rules to perform ASIC logic synthesis and physical design. An example of the ASIC library organization is given below:

|  | * Main ASIC Library * |  |
|---|---|---|
| High Power Library_VDDA | Lower Power Library_VDDB | Input output buffers Library_IO |
| VDDA | VDDB | VDDB/VDDC |
| NAND3_VDDA_1X | NAND3_VDDB_1X | RECEIVER_VDDA_VDDB |
| NOR3_VDDA_2X | NOR3_VDDB_2X | DRIVER_VDDA_VDDB |
| ADDF_VDDA_2X | ADDF_VDDB_2X |  |
| DFF_VDDA_3X | DFF_VDDB_3X |  |
| FILLER1_VDDA | FILLER1_VDDB |  |
| FILLER4_VDDA | FILLER4_VDDB |  |
| LVCONV_VDDB_2X |  |  |

LVCONV_VDDB_2X is a level converter function macro and is used when a low supply voltage circuit drives a high supply voltage circuit. The LVCONV_VDDB_2X macro uses both low and high voltage supplies. The LVCONV_VDDB_2X macro is made part of the high supply voltage sub-library. The low supply voltage bus within the LVCONV_VDDB_2X macro is given an input pin name instead of the usual power supply netname. For example, the low supply voltage bus can be called VDDIN instead of VDDA. In the ASIC netlist, the VDDIN nets are connected to VDDA and during the ASIC routing step, VDDIN pins are treated as signal pins and are connected to low power supply bus VDDA in the same manner as any other signal pin is wired.

The above-mentioned main library organization show only a few of the logic functions that the sub-libraries may have. Each macro entry in the sub-libraries has three qualifiers: logic function, power supply voltage, and capacitance load driving strength. The qualifiers make each of the macros and ASIC design rules for the same in the entire main library as unique entries. As will be described later, such uniqueness is necessary for performing ASIC level design checks.

Figure 3:
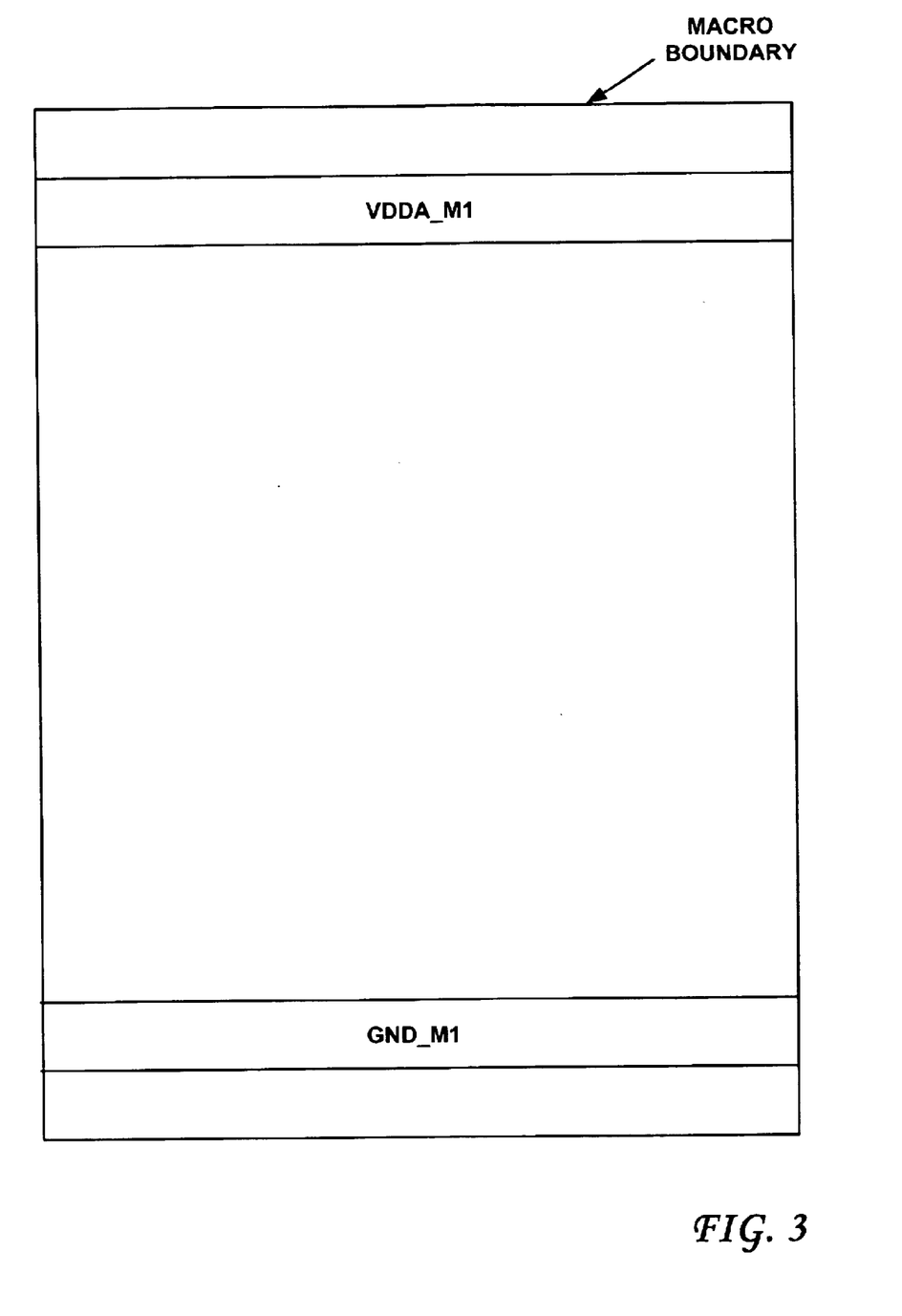
FIG. 3 is a layout of a filler cell used to fill spaces between circuit macros in a row to provide continuity for the VDDA_M1 and GND_M1 buses.

A filler cell layout is shown in FIG. 3. Power and ground buses in the filler cell marked as VDDA_M1 and GND_M1 are assigned net names VDDA and GND. Filler cells are used to fill unused core cell spaces in a row between circuit macros. In the same manner, physical design of other macros in the Library_VDDA can be completed. Library_VDDB macro set and filler cells are generated using the same method as that for Library_VDDA macro set except the power bus in these macros is given VDDB netname.

D. ASIC Logic Function Synthesis and Physical Design

Figure 4:
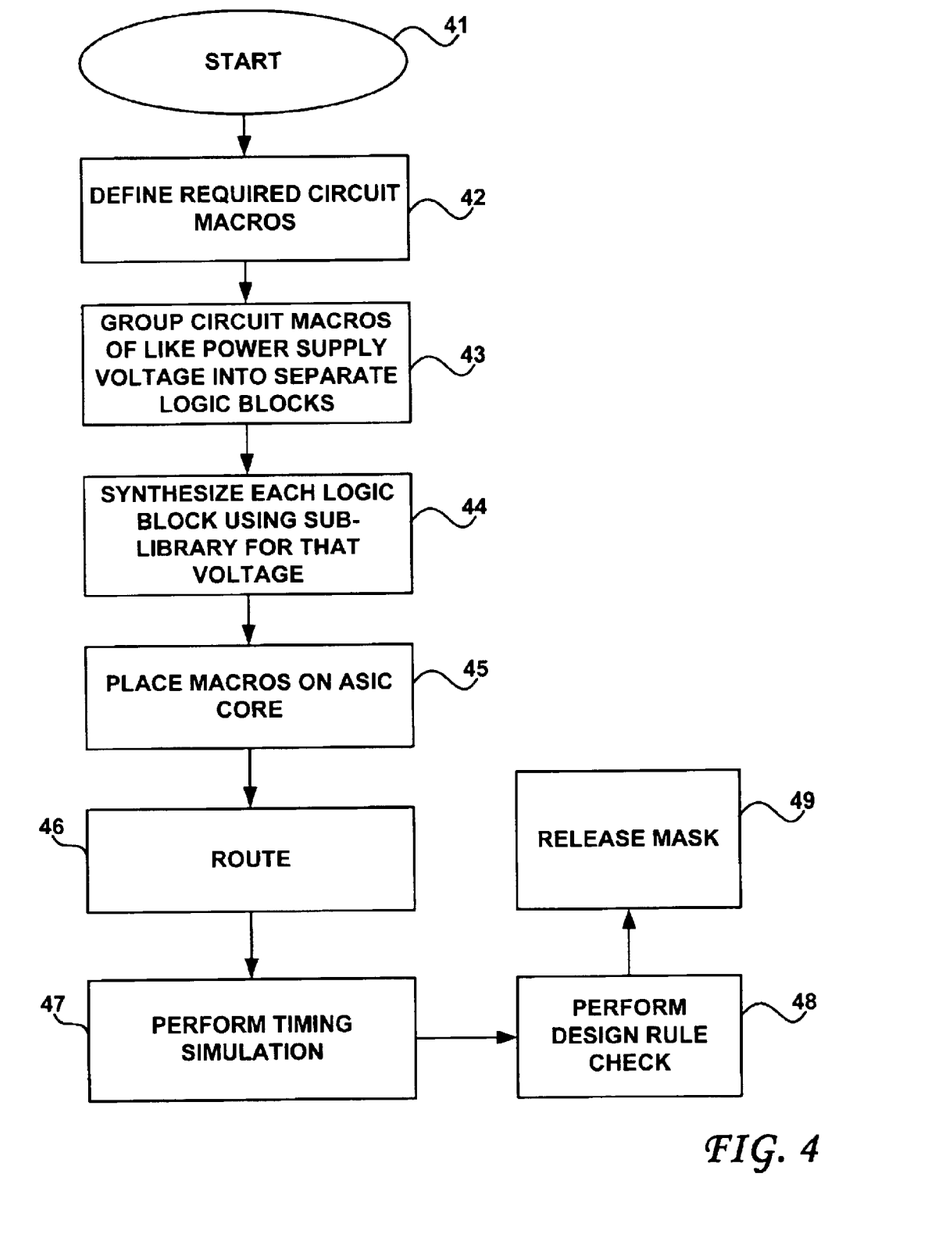
FIG. 4 is a high-level logic flow diagram of a method for designing an ASIC chip having multiple power supply voltages, in accordance with a preferred embodiment of the present invention.

With reference now to FIG. 4, there is illustrated a high-level logical flow diagram of a method for designing an ASIC chip having multiple power supply voltages, in accordance with a preferred embodiment of the present invention.

Starting in block 41, the circuit macros required by the ASIC chip are defined, as shown in block 42. Then, circuit macros of like power supply voltages are grouped into separate logic blocks, as depicted in block 43. For example, circuit macros that used a high supply voltage are grouped under a high-voltage supply logic block, and circuit macros that used a low supply voltage are grouped under a low-voltage supply logic block. Next, each logic block is synthesized using the sub-library corresponding to that voltage, as shown in block 44. For example, the high-voltage supply logic block is synthesized using the high-voltage sub-library, and the low-voltage supply logic block is synthesized using the low-voltage sub-library. The appropriate power bus and ground bus must be added to each logic block at metal layer M1. Then, macro circuits are placed in logic blocks within an ASIC core, as depicted in block 45. Next, routing is performed on the ASIC core, as shown in block 46. After performing timing simulation, as depicted in block 47, and design rule check, as shown in block 48, the mask can be released, as shown in block 49.

In general, an ASIC logic function is partitioned hierarchically in functional logic blocks. In this example, high power logic blocks are synthesized using macro set in the sub-library Library_VDDA and low power logic blocks are synthesized using macro set in the sub-library Library_VDDB. The macro circuits of each logic block are placed, using ASIC design system, in a rectangular area needed to accommodate all the macros of the logic block. Each logic block has an associated name and a qualifier indicating the sub-library with which the logic block was synthesized. Similarly, the core space used by each logic block carries the name of the logic block and region type. For example, logic block Adder16_VDDA can be designed using sub-library Library_VDDA, its layout is named as Adder16_VDDA_RegionA.

E. Integration of IP Macros in an ASIC Design

Figure 5:
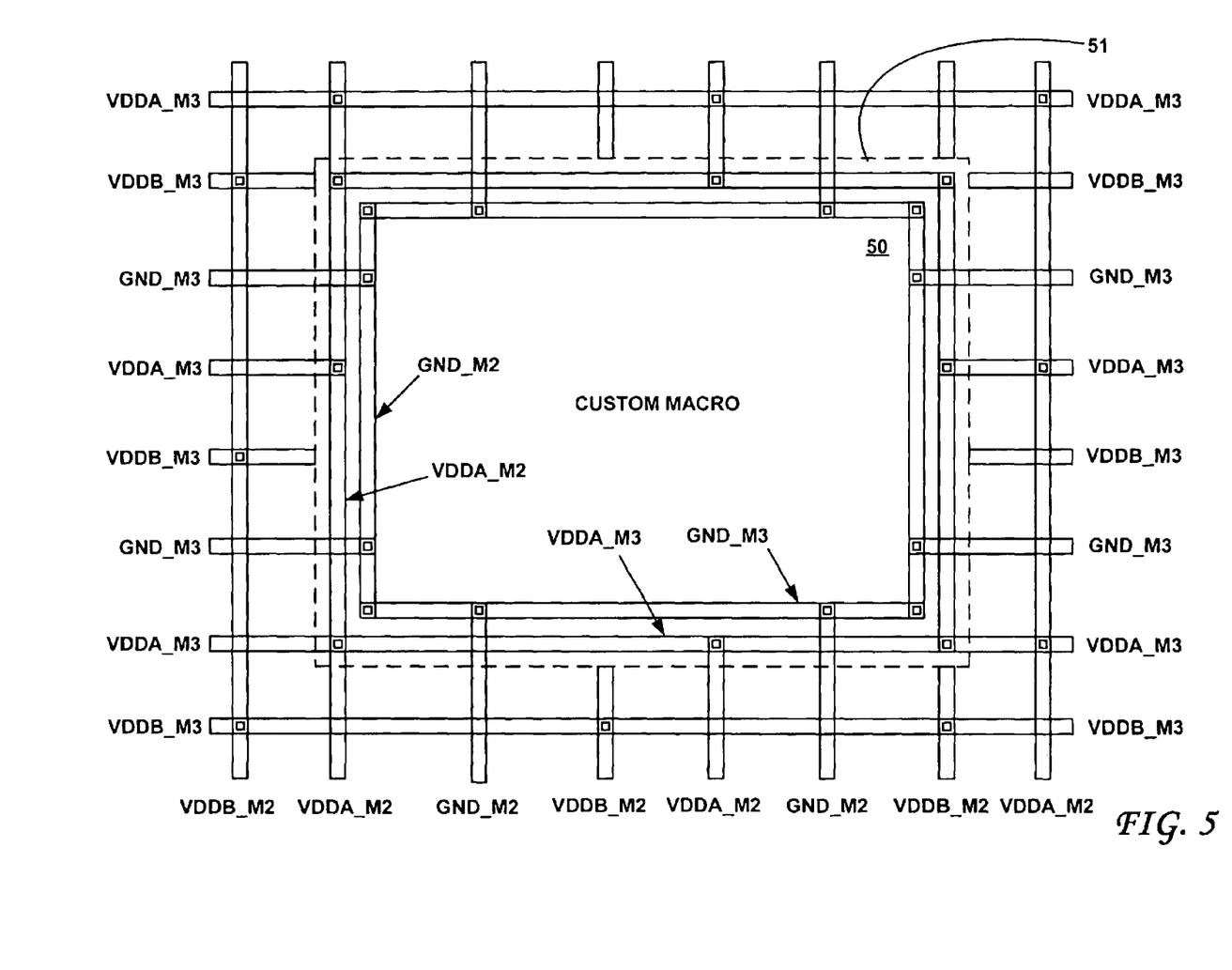
FIG. 5 depicts a custom macro placement in an ASIC design.

Intellectual Property (IP) macros can be embedded in a cell-based ASIC design. As shown in FIG. 5, an IP macro 50 is designed at power supply voltage VDDA. The boundary of IP macro 50 is indicated by a dotted line 51. Within the boundary of IP macro 50, there are power supply buses and ground buses, such as VDDA_M2, VDDA_M3, GND_M2, and GND_M3. In the same manner, IP macros designed using power supply voltage VDDB can be integrated in the ASIC design. One or more IP macros are placed in the ASIC core space in the same manner as the logic blocks configured with circuit macros from the sub-libraries.

Connections are made between the global power and ground buses and power and ground buses of IP macro 50. Vertical power and ground buses VDDA_M2, GND_M2 terminate on IP macro's horizontal VDDA_M3 and GND_M3 buses, respectively. Similarly, global horizontal buses VDDA_M3 and GND_M3 terminate on macro's vertical VDDA_M2 and GND_M2 buses. Other vertical and horizontal VDDB_M2, VDDB_M3 terminate at the boundary of the IP macro without making a connection to the buses of IP macro 50.

F. ASIC Chip Floor Plan

Figure 6:
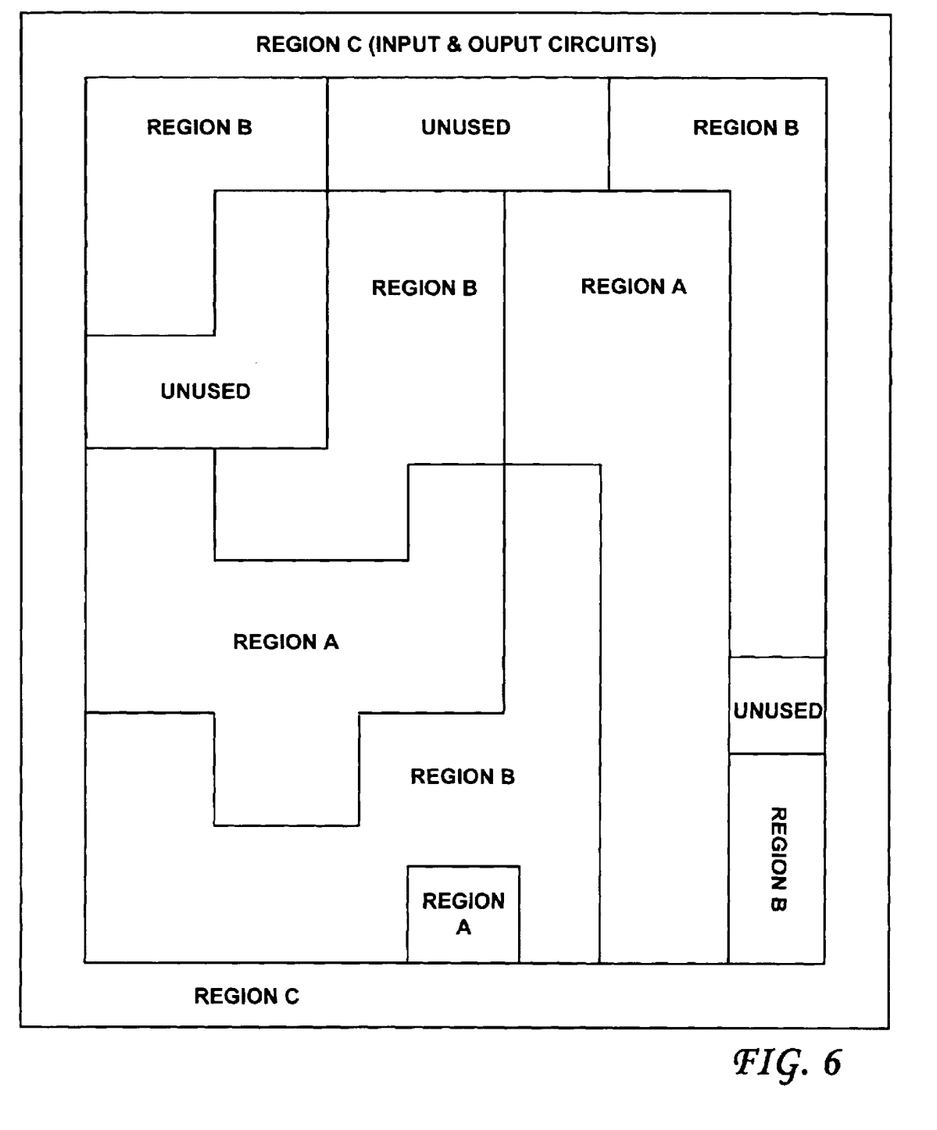
FIG. 6 shows the floor plan of an ASIC chip core.

With reference now to FIG. 6, there is depicted a graphical illustration of a floor plan of an ASIC core. Chip area includes input/output circuit space indicated as Region C at the periphery of the ASIC chip on all four sides enclosing the core space. After the logic blocks and IP macros are placed in the ASIC core area, the core space is represented by Region A, Region B and unused space. The floor plan is based on the data flow or connectivity between all the logic blocks and IP macros in the ASIC logic function. Region A represents the space occupied by logic block or blocks designed using Library_VDDA and IP macros designed at power supply VDDA. In the same manner, Region B represents the space occupied by logic block or blocks designed using Library_VDDB and IP macros designed at power supply VDDB.

When logic block type A is placed next to a logic block type B, as shown in FIG. 6, at least one unit space is left between the boundaries of these two types of blocks in the horizontal direction. The unit space is determined by the technology process rules. Such space provides isolation between the devices of logic block A connected to VDDA and devices of logic block B connected to VDDB. Such space also provides isolation between power supply buses VDDA_M1 and VDDB_M1. Logic blocks of the same type can be placed next to each other with their boundaries butted. FIG. 6 also illustrates an example of how the chip area may get divided into regions A, B, C and unused core space.

G. Placement of Power and Ground Buses

Figure 7:
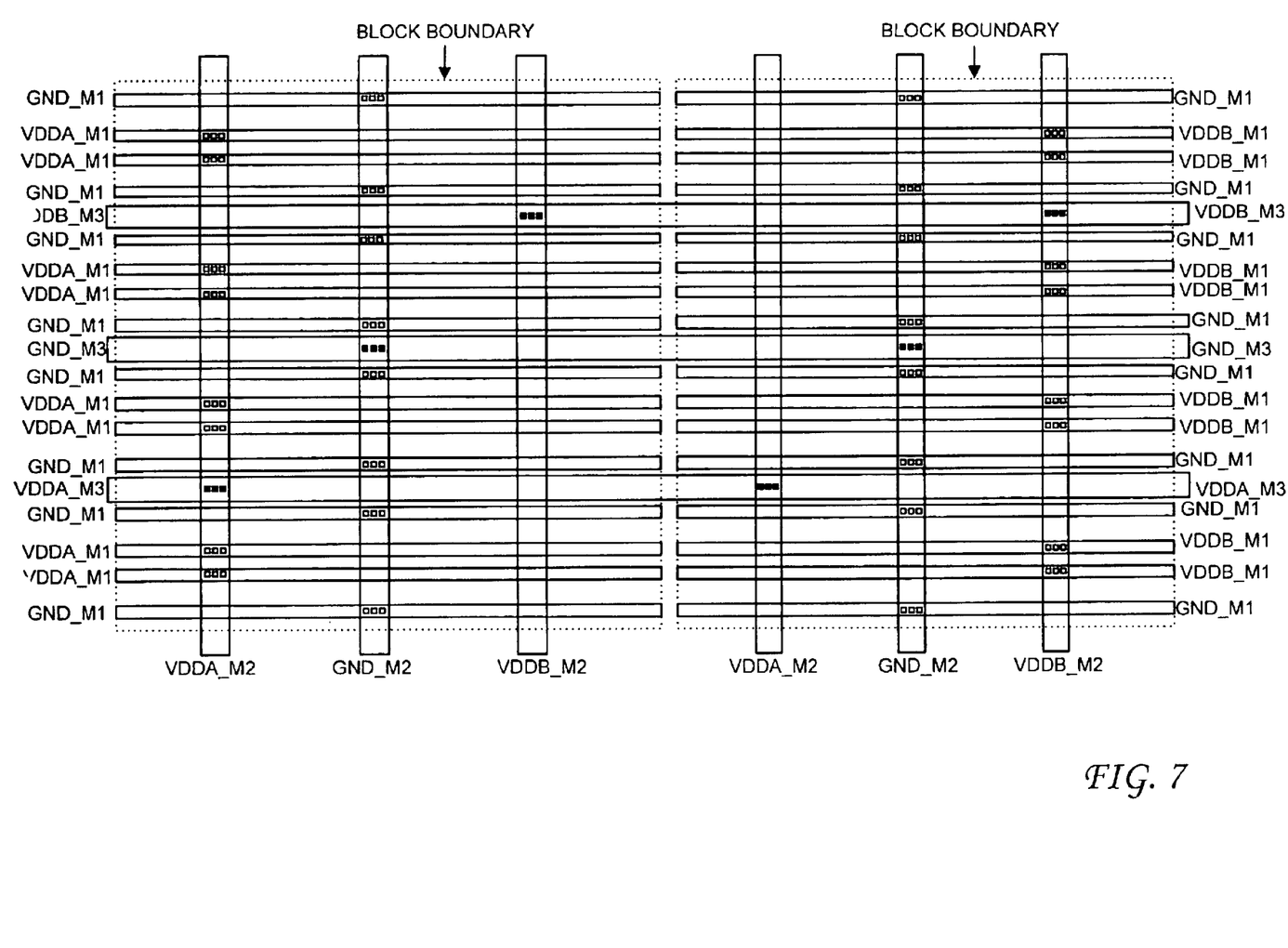
FIG. 7 shows layout of logic Block A placed adjacent to layout of logic Block B in the core space of an ASIC with a unit space between them.

After the logic blocks and IP macros have been placed in the ASIC core area, power and ground buses at metal level M2 to topmost metal level Mx are placed using a busing script. The busing script defines the width and space between the buses and also assigns netnames such as VDDA, VDDB and GND to the respective buses. The buses are continuous metal strips and extend across the whole core area in the respective directions. Sections of these buses at metal levels M2 and M3 are shown in logic blocks A and B of FIG. 7. The busing script also completes the interconnections between the VDDA buses at all metal levels including M1 in the circuit macros, VDDB buses at all metal levels and ground buses at all metal levels.

H. ASIC Global Routing

After the placement and power busing, the routing step can be completed with well-known techniques. The routing step also includes the routing between the primary input and output and core circuits.

I. ASIC Design Checks

Normal design rules checks are utilized. Since the multiple power supply buses had their unique netnames, logical to physical checks will flag any open or short errors associated with the power and ground nets.

As has been described, the present invention provides a method for designing a cell-based ASIC device with multiple power supply voltages in order to achieve optimum power performance. Although the present invention is described with the use of two power supply voltages, the same concept can be extended to more than two power supply voltages.

It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for designing a cell-based application specific integrated circuit (ASIC) device, said method comprising:

reserving metal layer M1 for power supply bus when developing a bus structure of an ASIC device image;

grouping circuit macros of like power supply voltage in said ASIC device image into respective logic blocks;

synthesizing said logic blocks using sub-libraries corresponding to respective power supply voltages for said logic blocks; and adding power supply bus for said power supply voltages to metal layer M1 in said logic blocks.

2. The method of claim 1, wherein one of said logic blocks contains a custom intellectual property macro.

3. The method of claim 1, wherein said method further includes utilizing a level convertor having multiple power supply voltages.

4. A computer program product residing on a computer usable medium for designing a cell-based application specific integrated circuit (ASIC) device, said computer program product comprising:

program code means for reserving metal layer M1 for power supply bus when developing a bus structure of an ASIC device image;

program code means for grouping circuit macros of like power supply voltages in said ASIC device image into respective logic blocks;

program code means for synthesizing said logic blocks using sub-libraries corresponding to respective power supply voltages for said logic blocks; and program code means for adding power supply bus for said power supply voltages to metal layer M1 in and logic blocks.

5. The computer program product of claim 4, wherein one of said logic blocks contains a custom intellectual property macro.

6. The computer program product of claim 4, wherein said computer program product further includes program code means for utilizing a level convertor baying multiple power supply voltages.

* * * * *